(12) United States Patent
Liu et al.

(10) Patent No.: US 11,312,829 B2
(45) Date of Patent: Apr. 26, 2022

(54) FLEXIBLE PREPREG AND USES THEREOF

(71) Applicant: TAIWAN UNION TECHNOLOGY CORPORATION, Chupei (TW)

(72) Inventors: Shur-Fen Liu, Chupei (TW); Chin-Hsien Hung, Chupei (TW)

(73) Assignee: TAIWAN UNION TECHNOLOGY CORPORATION, Chupei (TW)

( * ) Notice: Subject to any disclaimer, the term of this patent is extended or adjusted under 35 U.S.C. 154(b) by 451 days.

(21) Appl. No.: 16/380,833

(22) Filed: Apr. 10, 2019

(65) Prior Publication Data

US 2020/0216626 A1 Jul. 9, 2020

(30) Foreign Application Priority Data

Jan. 4, 2019 (TW) ................................ 108100372

(51) Int. Cl.
| | |
|---|---|
| *C08J 5/24* | (2006.01) |
| *H05K 1/03* | (2006.01) |
| *B32B 27/26* | (2006.01) |
| *B32B 27/32* | (2006.01) |
| *C08L 45/00* | (2006.01) |

(Continued)

(52) U.S. Cl.
CPC ............... *C08J 5/24* (2013.01); *B32B 5/022* (2013.01); *B32B 15/14* (2013.01); *C08J 3/24* (2013.01); *C08L 45/00* (2013.01); *H05K 1/0366* (2013.01); *B32B 2260/046* (2013.01); *B32B 2457/08* (2013.01); *C08J 2345/00* (2013.01); *C08J 2467/02* (2013.01); *C08J 2467/04* (2013.01); *C08J 2477/12* (2013.01); *C08L 2203/20* (2013.01); *C08L 2205/12* (2013.01); *C08L 2205/16* (2013.01); *C08L 2312/02* (2013.01);

(Continued)

(58) Field of Classification Search
None
See application file for complete search history.

(56) References Cited

U.S. PATENT DOCUMENTS

| 9,206,278 B2 | 12/2015 | Yoshida et al. | |
|---|---|---|---|
| 10,662,352 B2 * | 5/2020 | Liu | ............................ B32B 5/02 |

(Continued)

FOREIGN PATENT DOCUMENTS

| JP | S61-287939 A | 12/1986 |
|---|---|---|
| JP | H08-245872 A | 9/1996 |

(Continued)

OTHER PUBLICATIONS

Machine translation of JP-2002061064-A (no date).*

(Continued)

*Primary Examiner* — Michael J Feely
(74) *Attorney, Agent, or Firm* — Greer, Burns & Crain, Ltd

(57) ABSTRACT

A prepreg is provided. The prepreg is prepared by impregnating a liquid crystal polymer non-woven fabric with a thermal-curable resin composition or by coating a thermal-curable resin composition onto a liquid crystal polymer non-woven fabric and drying the impregnated or coated liquid crystal polymer non-woven fabric, wherein the thermal-curable resin composition includes:

(A) an unsaturated monomer; and
(B) a cyclic olefin copolymer including the following repeating units:
(B-1) a repeating unit of formula (I),

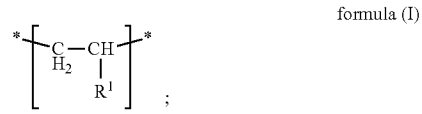

(B-2) a repeating unit of formula (II),

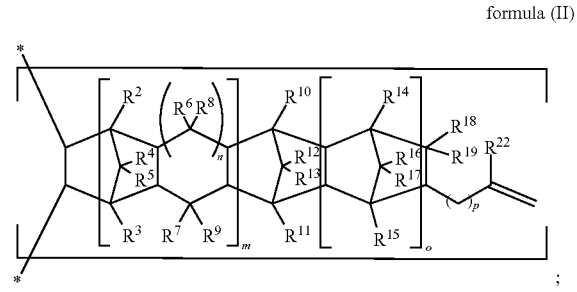

and
(B-3) a repeating unit of formula (III),

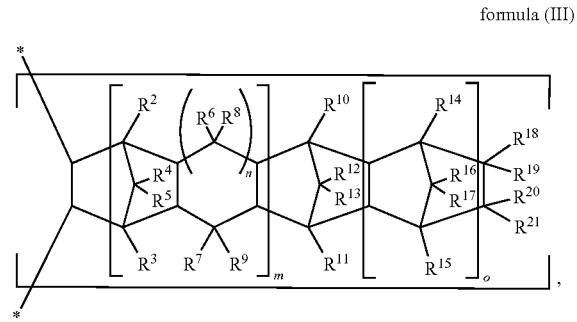

$R^1$ to $R^{22}$, m, n, o, and p in formulas (I) to (III) are as defined in the specification, (Continued)

wherein based on the total moles of the repeating units (B-1) to (B-3), the content of the repeating unit (B-2) is 19 mol % to 36 mol %, and wherein the weight ratio of the cyclic olefin copolymer (B) to the unsaturated monomer (A) is 0.5 to 7.

14 Claims, No Drawings

(51) Int. Cl.
*B32B 5/02* (2006.01)
*B32B 15/14* (2006.01)
*C08J 3/24* (2006.01)
*C08L 23/00* (2006.01)
*C09J 123/00* (2006.01)

(52) U.S. Cl.
CPC .................. *H05K 2201/012* (2013.01); *H05K 2201/0141* (2013.01); *H05K 2201/0158* (2013.01)

(56) References Cited

U.S. PATENT DOCUMENTS

| | | |
|---|---|---|
| 2018/0270945 A1 | 9/2018 | Takahashi et al. |
| 2019/0062541 A1 | 2/2019 | Saito et al. |

FOREIGN PATENT DOCUMENTS

| | | | | |
|---|---|---|---|---|
| JP | 2002061064 A | * | 2/2002 | ............. D04H 3/011 |
| JP | 2004352845 A | | 12/2004 | |
| JP | 4429501 B2 | | 3/2010 | |
| JP | 2018035257 A | * | 3/2018 | ............... C08K 5/00 |
| TW | 201805358 A | | 2/2018 | |
| WO | WO-2017150218 A1 | * | 9/2017 | ........... C09D 123/16 |

OTHER PUBLICATIONS

Machine translation of JP-2018035257-A (no date).*
Taiwanese Office Action from Taiwanese counterpart Patent Application No. 108100372, dated Mar. 13, 2020.

* cited by examiner

FLEXIBLE PREPREG AND USES THEREOF

CLAIM FOR PRIORITY

This application claims the benefit of Taiwan Patent Application No. 108100372 filed on Jan. 4, 2019, the subject matter of which is entirely incorporated herein by reference.

BACKGROUND

Field of the Invention

The present invention provides a flexible prepreg, especially a flexible prepreg that is prepared by impregnating a liquid crystal polymer non-woven fabric with a thermal-curable resin composition or by coating a thermal-curable resin composition onto a liquid crystal polymer non-woven fabric and drying the impregnated or coated liquid crystal polymer non-woven fabric, and a flexible metal-clad laminate and a printed circuit board provided by using the flexible prepreg.

Descriptions of the Related Art

A printed circuit board (PCB) is used as a substrate of an electronic device for accommodating various electronic components that are electrically connected with each other to provide a stable circuit working environment. The printed circuit board is basically manufactured from a laminate which is formed of alternating laminated dielectric layers and conductive layers. Generally, the printed circuit board can be prepared by the following method.

First, a reinforcing material (e.g., a glass-fiber fabric) is impregnated into a resin (e.g., an epoxy resin). The resin-impregnated reinforcing material is cured to a semi-cured state (known as B-stage) to obtain a prepreg as a dielectric layer. Afterwards, a predetermined number of dielectric layers (i.e., prepregs) are superimposed, and a conductive layer (e.g., a metal foil) is superimposed on at least one external surface of the superimposed dielectric layers to provide a superimposed object. Then, the superimposed object is subjected to a hot-pressing operation (known as C-stage) to obtain a laminate. The conductive layer of the laminate is etched to form a predetermined circuit pattern. Finally, the etched laminate is subjected to a drilling process to form a plurality of holes thereon, and a conductive material is plated in such holes to form via holes, thereby, obtaining the printed circuit board.

However, due to the miniaturization of electronic devices, the printed circuit board increasingly needs to be thinner and more densely packed and must meet high-frequency and high-speed transmission requirements. At present, mostly fluororesin substrates or polyphenylene ether resin substrates are used to meet the high-frequency and high-speed transmission requirements. For example, JP 61-287939 discloses a laminate which is prepared by laminating a resin-impregnated substrate and then subjecting it to irradiation, wherein the resin-impregnated substrate is formed by impregnating a substrate with a resin composition containing a polyphenylene ether and a crosslinked polymer. JP 8-245872 discloses a curable composite material comprising a reaction product of polyphenylene ether and unsaturated carboxylic acid or anhydride, triallyl cyanurate and/or triallyl isocyanurate, a peroxide, a flame retardant, an antimony oxide and a substrate. However, in the abovementioned embodiments, a glass fiber substrate is used, and the prepared material is not flexible.

US 2018270945 also discloses a multilayer printed wiring board formed by stacking insulating layers (i.e., dielectric layers) and conductive layers, wherein the insulating layer comprises a liquid crystal polymer resin layer, which is a thin film prepared from a liquid crystal polymer resin. Although the resultant multilayer printed wiring board has flexibility, the adhesion between the insulating layer and the conductive layer is poor, thereby lowering the reliability of the multilayer printed wiring board.

SUMMARY

In view of the abovementioned technical problems, the present invention provides a prepreg by using a liquid crystal polymer non-woven fabric and a thermal-curable resin composition, wherein the prepreg has flexibility and can be shaped into a three-dimensional wiring structure according to the shape of the space, thereby, increasing the wiring density of the system and reducing the volume of the product. In addition, the flexible metal-clad laminate prepared by using the prepreg of the present invention has a low dielectric constant (Dk) value, a low dissipation factor (Df), high heat resistance, and high adhesion between the conductive layer and the dielectric layer, and so on.

Therefore, an objective of the present invention is to provide a prepreg, which is prepared by impregnating a liquid crystal polymer non-woven fabric with a thermal-curable resin composition or by coating a thermal-curable resin composition onto a liquid crystal polymer non-woven fabric and drying the impregnated or coated liquid crystal polymer non-woven fabric, wherein the thermal-curable resin composition comprises:

(A) an unsaturated monomer; and (B) a cyclic olefin copolymer comprising the following repeating units:

(B-1) a repeating unit of formula (I),

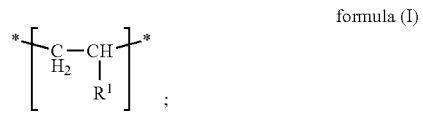

formula (I)

(B-2) a repeating unit of formula (II),

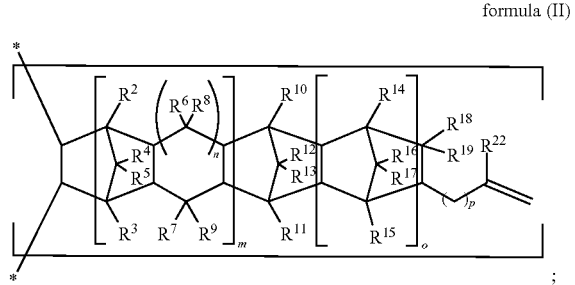

formula (II)

and (B-3) a repeating unit of formula (III), $$\text{formula (III)}$$

wherein, in formulas (I) to (III),
$R^1$ is H or a $C_1$ to $C_{29}$ linear or branched hydrocarbon group, and specifically, $R^1$ may be H or a $C_1$ to $C_6$ alkyl;
$R^2$ to $R^{21}$ are independently H, a halogen, a $C_1$ to $C_{20}$ alkyl, a $C_1$ to $C_{20}$ halogenated alkyl, a $C_3$ to $C_{15}$ cycloalkyl, or a $C_6$ to $C_{20}$ aromatic hydrocarbyl;
$R^{18}$ to $R^{21}$ may bind to each other to form a monocyclic ring or polycyclic ring;
$R^{22}$ is H or a $C_1$ to $C_{10}$ alkyl;
m and n are independently 0 or 1;
o is 0 or a positive integer;
p is an integer from 0 to 10; and
in formula (III), when both m and n are 0, at least one of $R^{10}$ to $R^{13}$ and $R^{18}$ to $R^{21}$ is not H,
wherein, based on the total moles of the repeating units (B-1), (B-2) and (B-3), the content of the repeating unit (B-2) is 19 mol % to 36 mol % and preferably 20 mol % to 33 mol %; and
wherein the weight ratio of the cyclic olefin copolymer (B) to the unsaturated monomer (A) is 0.5 to 7, and specifically, the weight ratio of the cyclic olefin copolymer (B) to the unsaturated monomer (A) may be 0.6 to 2.4.

In some embodiments of the present invention, the unsaturated monomer (A) is selected from the group consisting of an alkenyl-containing aromatic monomer, an allyl-containing monomer, an acryloyl-containing monomer, a vinyl ether, a maleimide, and combinations thereof.

In some embodiments of the present invention, the allyl-containing monomer is an organic compound comprising at least one allyl.

In some embodiments of the present invention, the allyl-containing monomer is selected from the group consisting of diallyl phthalate, diallyl isophthalate, triallyl mellitate, triallyl mesate, triallyl benzene, triallyl cyanurate, triallyl isocyanurate, triallyl amine, and combinations thereof.

In some embodiments of the present invention, the repeating unit (B-2) is formed by the addition copolymerization of cyclic non-conjugated diene monomers, wherein the cyclic non-conjugated diene monomer is selected from the group consisting of -continued

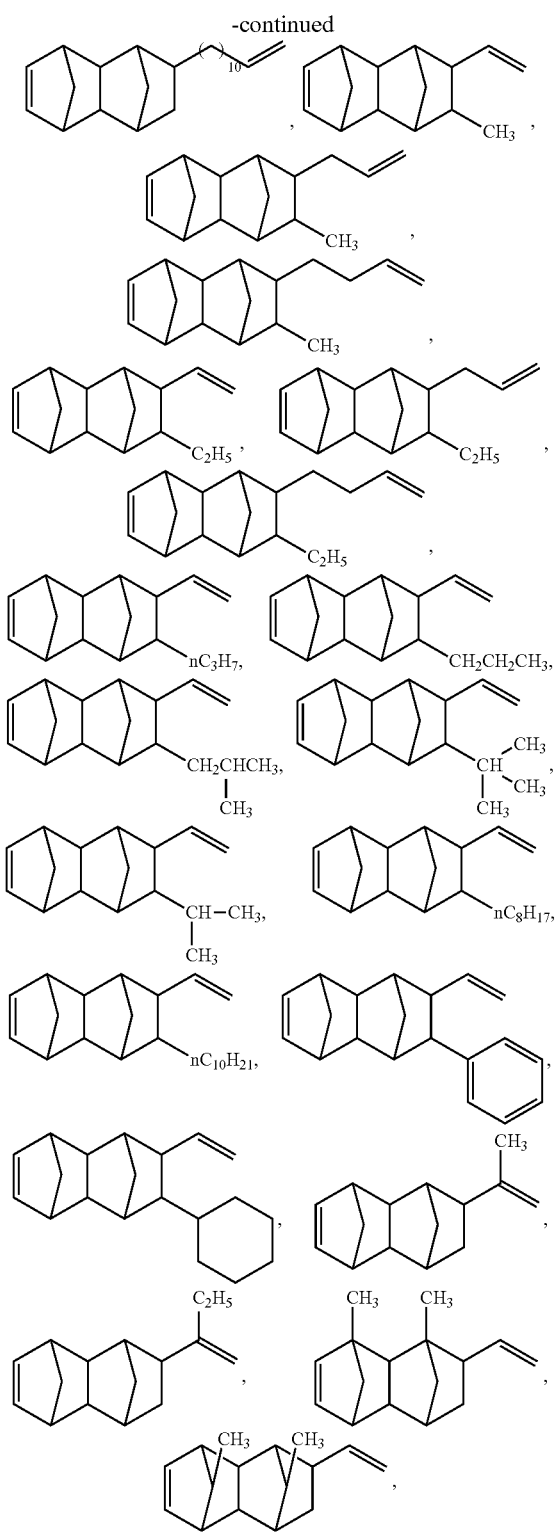

and combinations thereof.

In some embodiments of the present invention, the thermal-curable resin composition may further comprise a flame retardant, a catalyst, a filler, a curing accelerator, a dispersing agent, a toughener, a viscosity modifier, a thixotropic agent, a defoamer, a leveling agent, a surface treatment agent, a stabilizing agent, an antioxidant, or combinations thereof. The flame retardant may be selected from the group consisting of a phosphorus-containing flame retardant, a bromine-containing flame retardant, and combinations thereof. The catalyst may be selected from the group consisting of dicumyl peroxide, α,α'-bis(t-butylperoxy)diisopropyl benzene, benzoyl peroxide, and combinations thereof.

In some embodiments of the present invention, the liquid crystal polymer non-woven fabric comprises a liquid crystal polyester fiber with an average diameter ranging from 0.6 μm to 20 μm and elongations in the machine direction (MD) and the cross direction (CD) independently ranging from 1% to 8%. The liquid crystal polyester fiber may have one or more of the following repeating units (1) to (11):

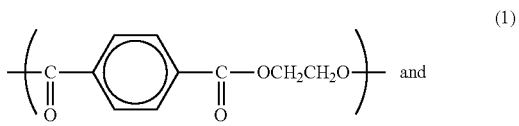 and

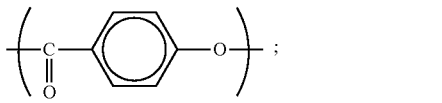 ; (1)

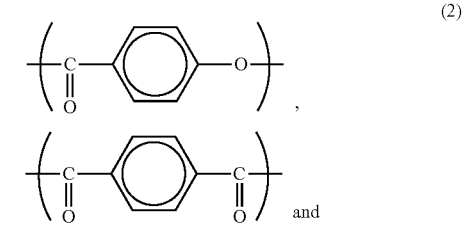 , and (2)

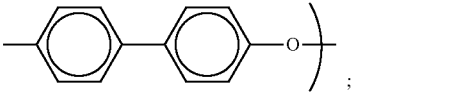 ;

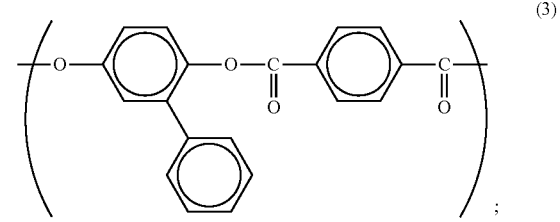 ; (3)

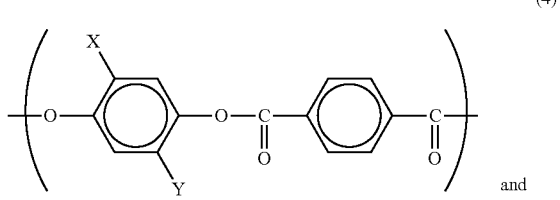 and (4)

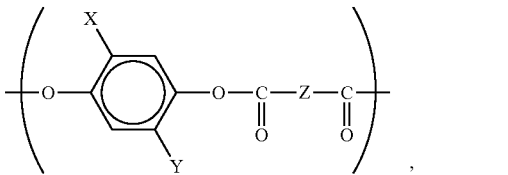 , wherein X, X', Y and Y' are independently H, Cl, Br or methyl, and Z is

[chemical structures of Z groups: phenylene; diphenyl ether; naphthalene; -C₆H₄-OCH₂CH₂O-C₆H₄-; or biphenyl];

(5) [-O-C₆H₄-C(=O)-] and

[-O-naphthalene-C(=O)-];

(6) [-O-naphthalene-C(=O)-], [-O-C₆H₄-O-] and [-C(=O)-C₆H₄-C(=O)-];

(7) [-O-naphthalene-C(=O)-], [-O-C₆H₄-NH-] and [-C(=O)-C₆H₄-C(=O)-];

(8) [-O-C₆H₄-C(=O)-], [-O-C₆H₄-O-], [-C(=O)-naphthalene-C(=O)-] and

[-O-C₆H₄(ortho)-C(=O)-];

(9) [-O-naphthalene-C(=O)-], [-O-C₆H₄-C(=O)-], [-C(=O)-C₆H₄-C(=O)-] and [-O-C₆H₄-C₆H₄-O-];

(10) [-O-naphthalene-C(=O)-], [-O-C₆H₄-C(=O)-], [-O-C₆H₄-C₆H₄-O-] and [-O-C₆H₄-NH-], [-C(=O)-C₆H₄-C(=O)-]; and

(11) [-O-C₆H₄-C(=O)-], [-O-C₆H₄-C₆H₄-O-], [-C(=O)-C₆H₄-C(=O)-] and [-C(=O)-C₆H₄(meta)-C(=O)-].

In some embodiments of the present invention, the liquid crystal polyester fiber has repeating units of the following formulas (IV) and (V), and based on 100 mol % of the total amount of repeating units in the liquid crystal polyester, the total amount of the repeating units of formulas (IV) and (V) is at least 65 mol %,

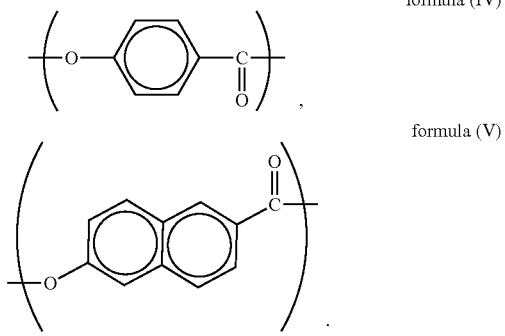

formula (IV)

formula (V)

Another objective of the present invention is to provide a metal-clad laminate, which is prepared by laminating the abovementioned prepreg and a metal foil.

Yet another objective of the present invention is to provide a printed circuit board, which is prepared from the abovementioned metal-clad laminate To render the above objectives, technical features and advantages of the present invention more apparent, the present invention will be described in detail with reference to some embodiments hereinafter.

BRIEF DESCRIPTION OF THE DRAWINGS

Not applicable.

DETAILED DESCRIPTION

Hereinafter, some embodiments of the present invention will be described in detail. However, without departing from the spirit of the present invention, the present invention may be embodied in various embodiments and should not be construed to be limited to the embodiments described in the specification.

Unless it is additionally explained, the expressions "a," "the," or the like recited in the specification (especially in the claims) should include both the singular and the plural forms.

Unless it is additionally explained, while describing the components in the solution, mixture and composition in the specification, the amount of each component is calculated based on the dry weight, i.e., regardless of the weight of the solvent.

Unless it is additionally explained, an alkyl, an alkenyl, an alkynyl, an aromatic hydrocarbyl or the like, recited in the specification (especially in the claims) comprise linear, branched and/or cyclic forms.

The prepreg of the present invention is prepared by impregnating a liquid crystal polymer non-woven fabric with a thermal-curable resin composition or by coating a thermal-curable resin composition onto a liquid crystal polymer non-woven fabric and drying the impregnated or coated liquid crystal polymer non-woven fabric. The detailed descriptions for each component of the prepreg of the present invention and the preparation method thereof are provided below.

1. Thermal-Curable Resin Composition

In the prepreg of the present invention, the thermal-curable resin composition comprises an unsaturated monomer (A) and a cyclic olefin copolymer (B) as necessary components, and other optional components that may be used depending on the need. The detailed descriptions for each component of the thermal-curable resin composition are provided below.

1.1. Unsaturated Monomer (A)

In the thermal-curable resin composition of the present invention, the unsaturated monomer (A) refers to a polymerizable monomer that contains carbon-carbon double bond(s) and can react with other unsaturated olefins. Examples of the unsaturated monomer include but are not limited to an alkenyl-containing aromatic monomer, an allyl-containing monomer, an acryloyl-containing monomer, a vinyl ether, a maleimide, and combinations thereof.

1.1.1. Alkenyl-Containing Aromatic Monomer

The alkenyl-containing aromatic monomer may be a monomer represented by the following formula:

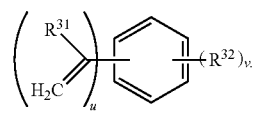

In the abovementioned formula, each of $R^{31}$ is independently H or a $C_1$ to $C_{18}$ hydrocarbon group; each of $R^{32}$ is independently H, a $C_1$ to $C_{12}$ alkyl, a $C_1$ to $C_{12}$ alkoxy, or a $C_6$ to $C_{18}$ aryl; u is 1 to 4; and v is 0 to 5. The $C_1$ to $C_{18}$ hydrocarbon group includes but is not limited to a $C_1$ to $C_{12}$ alkyl, a $C_2$ to $C_{12}$ alkenyl, a $C_2$ to $C_{12}$ alkynyl, and a $C_6$ to $C_{18}$ aryl. Examples of the $C_1$ to $C_{12}$ alkyl include but are not limited to methyl, ethyl, n-propyl, isopropyl, n-butyl, isobutyl, tert-butyl, n-pentyl, isopentyl, tert-pentyl, neopentyl, n-hexyl, isohexyl, n-heptyl, isoheptyl, n-octyl, isooctyl, n-nonyl, isononyl, n-decyl, isodecyl, undecyl, and dodecyl. Examples of the $C_2$ to $C_{12}$ alkenyl include but are not limited to vinyl, propenyl, allyl, n-butenyl, isobutenyl, pentenyl, hexenyl, heptenyl, octenyl, nonenyl, decenyl, butadienyl, pentadienyl, and hexadienyl. Examples of the $C_2$ to $C_{12}$ alkynyl include but are not limited to ethynyl, propynyl, butynyl, pentynyl, hexynyl, heptynyl, octynyl, nonynyl, and decynyl. Examples of the $C_1$ to $C_{12}$ alkoxy include but are not limited to methoxy, ethoxy, propoxy, butoxy, pentyloxy, and hexyloxy. Examples of the $C_6$ to $C_{18}$ aryl include but are not limited to phenyl, biphenyl, naphthyl, anthranyl, phenanthryl, indenyl, fluorenyl, and anthronyl.

Examples of the alkenyl-containing aromatic monomer include but are not limited to styrene, divinylbenzene (DVB), divinylnaphthalene, divinylbiphenyl, diisopropenyl benzene, and combinations thereof. Examples of styrene include but are not limited to a-methyl styrene, 2-methyl styrene, 3-methyl styrene, 4-methyl styrene, 2-tert-butyl styrene, 3-tert-butyl styrene, 4-tert-butyl styrene, and a styrene containing 1 to 5 halogen substitutes on its benzene ring. Examples of divinylbenzene include but are not limited to 1,3-divinylbenzene and 1,4-divinylbenzene. Examples of diisopropenyl benzene include but are not limited to 1,3-diisopropenyl benzene and 1,4-diisopropenyl benzene. In the appended Examples, divinylbenzene (DVB) is used.

1.1.2. Allyl-Containing Monomer

The allyl-containing monomer is an organic compound that comprises at least one allyl (—$CH_2$—CH=$CH_2$), preferably at least two allyls, and more preferably at least three allyls. Examples of the allyl-containing monomer include but are not limited to diallyl phthalate, diallyl isophthalate, triallyl mellitate, triallyl mesate, triallyl benzene, triallyl cyanurate (TAC), triallyl isocyanurate (TAIC), and triallyl amine. The abovementioned compounds can be used either alone or in any combination. In the appended Examples, triallyl isocyanurate (TAIC) is used.

1.1.3. Acryloyl-Containing Monomer

The acryloyl-containing monomer is a compound that comprises at least one acryloyl moiety with the following structure, preferably at least two acryloyl moieties with the following structure, and more preferably at least three acryloyl moieties with the following structure:

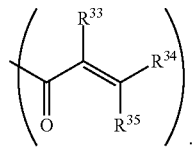

In the acryloyl moiety, $R^{33}$ to $R^{35}$ are independently H, a $C_1$ to $C_{12}$ hydrocarbon group, a $C_2$ to $C_{18}$ hydrocarbonoxy carbonyl, cyano (—C≡N), formyl (—CHO), carboxyl (—C(=O)OH), an imidate group (—C(=NH)OH), or a thiocarboxylic acid group (—C(=O)SH). The $C_1$ to $C_{12}$ hydrocarbon group includes but is not limited to a $C_1$ to $C_{12}$ alkyl, a $C_2$ to $C_{12}$ alkenyl, a $C_2$ to $C_{12}$ alkynyl, and a $C_6$ to $C_{12}$ aryl. Examples of the $C_1$ to $C_{12}$ alkyl, $C_2$ to $C_{12}$ alkenyl, $C_2$ to $C_{12}$ alkynyl, and $C_6$ to $C_{12}$ aryl are as described above. The $C_2$ to $C_{18}$ hydrocarbonoxy carbonyl includes but is not limited to a $C_2$ to $C_{12}$ alkoxy carbonyl and a $C_7$ to $C_{18}$ aryloxy carbonyl. Examples of $C_2$ to $C_{12}$ alkoxy carbonyl include but are not limited to ethoxy carbonyl, propoxy carbonyl, butoxy carbonyl, pentyloxy carbonyl, hexyloxy carbonyl, heptyloxy carbonyl, octyloxy carbonyl, nonyloxy carbonyl, and decyloxy carbonyl. Examples of $C_7$ to $C_{18}$ aryloxy carbonyl include but are not limited to phenoxy carbonyl and naphthyloxy carbonyl.

Examples of the acryloyl-containing monomer include but are not limited to tris(hydroxymethyl)propane tri(meth)acrylate, 1,6-hexanediol di(meth)acrylate, neopentyl glycol di(meth)acrylate, ethylene glycol di(meth)acrylate, propylene glycol di(meth)acrylate, cyclohexane dimethanol di(meth)acrylate, tricyclodecane dimethanol di(meth)acrylate (DCP), butylene glycol di(meth)acrylate, diethylene glycol di(meth)acrylate, triethylene glycol di(meth)acrylate, isobornyl (meth)acrylate, methyl (meth)acrylate, methylacryloyloxypropyltrimethoxysilane, and ethoxylated (2) bisphenol A di(meth)acrylate, wherein the number which follows the term "ethoxylated" refers to the average number of ethoxy in the ethoxy compound chain that connects to each oxygen of bisphenol A. The abovementioned compounds can be used either alone or in any combination. In the appended Examples, tricyclodecane dimethanol di(meth)acrylate (DCP) is used.

1.1.4. Vinyl Ether

The vinyl ether is a compound that comprises at least one vinyl ether group (—O—CH=CH$_2$), preferably at least two vinyl ether groups, and more preferably at least three vinyl ether groups. Examples of the vinyl ether include but are not limited to 1,2-ethylene glycol divinyl ether, 1,3-propylene glycol divinyl ether, 1,4-butylene glycol divinyl ether, triethylene glycol divinyl ether, 1,4-cyclohexane dimethanol divinyl ether, ethyl vinyl ether, n-butyl vinyl ether, dodecyl vinyl ether, and 2-chloroethyl vinyl ether. The aforementioned compounds can be used either alone or in any combination.

1.1.5. Maleimide

The maleimide is a compound that comprises at least one maleimide group represented by the following structure:

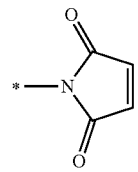

The maleimide preferably comprises at least two maleimide groups, and more preferably at least three maleimide groups. Examples of the maleimide include but are not limited to N-phenyl maleimide, 1,4-phenylene-bismethyl-α,α'-bismaleimide, 2,2-bis(4-phenoxyphenyl)-N,N'-bismaleimide, N,N'-phenylene bismaleimide, N,N'-hexamethylene bismaleimide, N,N'-biphenyl methane bismaleimide, N,N'-oxy-di-p-phenylene bismaleimide, N,N'-4,4'-benzophenone bismaleimide, N,N'-p-biphenyl sulfone bismaleimide, N,N'-(3,3'-dimethyl)methylene-di-p-phenylene bismaleimide, poly(phenyl methyl ene)polymaleimide, bis(4-phenoxyphenyl) sulfone-N,N'-bismaleimide, 1,4-bis(4-phenoxy)benzene-N,N'-bismaleimide, 1,3-bis(4-phenoxy)benzene-N,N'-bismaleimide, and 1,3-bis(3-phenoxy) benzene-N,N'-bismaleimide. The aforementioned compounds can be used either alone or in any combination.

In the present invention, based on the total weight of the resin composition, the amount of the unsaturated monomer (A) can range from 12 wt % to 70 wt %, preferably 15 wt % to 60 wt %, and more preferably 18 wt % to 50 wt %, such as 19 wt %, 20 wt %, 22 wt %, 25 wt %, 28 wt %, 30 wt %, 32 wt %, 35 wt %, 38 wt %, 40 wt %, 42 wt %, 45 wt %, 48 wt %, or 49 wt %.

1.2. Cyclic Olefin Copolymer (B)

The cyclic olefin copolymer (B) is another necessary compound of the thermal-curable resin composition. The cyclic olefin copolymer (B) has cross-linkable group(s) and comprises a repeating unit (B-1) of the following formula (I), a repeating unit (B-2) of the following formula (II), and a repeating unit (B-3) of the following formula (III).

formula (I)

formula (II)

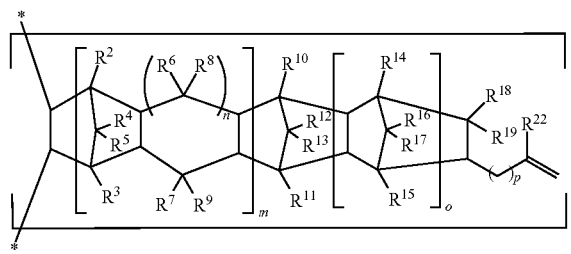

formula (III)

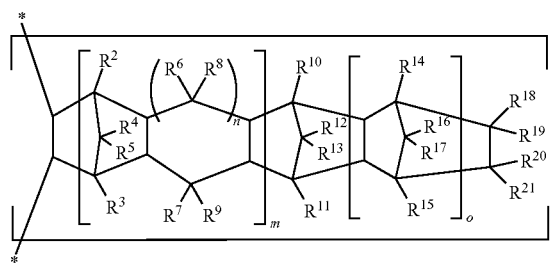

In formulas (I) to (III), $R^1$ is H or a $C_1$ to $C_{29}$ linear or branched hydrocarbon group, and preferably H or a $C_1$ to $C_{29}$ alkyl; $R^2$ to $R^{21}$ are independently H, a halogen, a $C_1$ to $C_{20}$ alkyl, a $C_1$ to $C_{20}$ halogenated alkyl, a $C_3$ to $C_{15}$ cycloalkyl, or a $C_6$ to $C_{20}$ aromatic hydrocarbyl, and $R^{18}$ to $R^{21}$ may bind to each other to form a monocyclic ring or polycyclic ring; $R^{22}$ is H or a $C_1$ to $C_{10}$ alkyl; m and n are independently 0 or 1; o is 0 or a positive integer, preferably an integer from 0 to 50, and more preferably an integer from 0 to 20; p is an integer from 0 to 10; and in formula (III), when both m and n are 0, at least one of $R^{10}$ to $R^{13}$ and $R^{18}$ to $R^{21}$ is not H.

The repeating unit (B-1) of formula (I) is formed by an addition copolymerization of one or more monomers of the following formula (I-1).

formula (I-1)
$$H_2C=CH \atop | \atop R^1$$

In formula (I-1), $R^1$ is H or a $C_1$ to $C_{29}$ linear or branched hydrocarbon group, preferably H or a $C_1$ to $C_{29}$ linear or branched hydrocarbon alkyl, and more preferably H or a $C_1$ to $C_6$ linear or branched hydrocarbon alkyl, such as methyl, ethyl, n-propyl, isopropyl, n-butyl, isobutyl, tert-butyl, n-pentyl, isopentyl, tert-pentyl, neopentyl, n-hexyl, or isohexyl.

Examples of the monomer of formula (I-1) include but are not limited to ethylene, propylene, 1-butene, 1-pentene, 1-hexene, 3-methyl-1-butene, 3-methyl-1-pentene, 3-ethyl-1-pentene, 4-methyl-1-pentene, 4-methyl-1-hexene, 4,4-dimethyl-1-hexene, 4,4-dimethyl-1-pentene, 4-ethyl-1-hexene, 3-ethyl-1-hexene, 1-octene, 1-decene, 1-dodecene, 1-tetradecene, 1-hexadecene, 1-octadecene, and 1-eicosene. In the appended Examples, the repeating unit (B-1) of formula (I) is formed by an addition copolymerization of ethylene.

The repeating unit (B-2) of formula (II) is formed by an addition copolymerization of one or more cyclic non-conjugated diene monomers of the following formula (II-1).

formula (II-1)

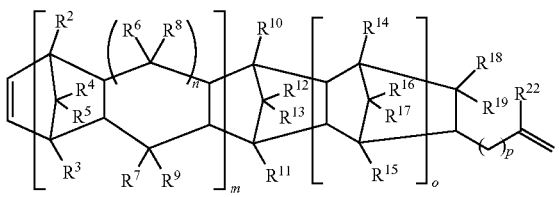

In formula (II-1), $R^2$ to $R^{19}$ may be identical or different and may be independently H, a halogen, a $C_1$ to $C_{20}$ alkyl, a $C_1$ to $C_{20}$ halogenated alkyl, a $C_3$ to $C_{15}$ cycloalkyl, or a $C_6$ to $C_{20}$ aryl, wherein $R^{18}$ and $R^{19}$ may bind to each other to form a monocyclic ring or polycyclic ring; $R^{22}$ is H or a $C_1$ to $C_{10}$ alkyl; m and n are independently 0 or 1; o is 0 or a positive integer, preferably an integer from 0 to 50, and more preferably an integer from 0 to 20; and p is an integer from 0 to 10. It is preferable that $R^2$ to $R^{19}$ are independently H, a $C_1$ to $C_{10}$ alkyl, a $C_3$ to $C_8$ cycloalkyl, or a $C_6$ to $C_{12}$ aryl, $R^{22}$ is H or a $C_1$ to $C_6$ alkyl, and o is 0, 1, or 2. Examples regarding the $C_1$ to $C_{10}$ alkyl and the $C_6$ to $C_{12}$ aryl are as described above. Examples of the $C_3$ to $C_8$ cycloalkyl include but are not limited to cyclopropyl, cyclobutyl, cyclopentyl, cyclohexyl, cycloheptyl, and cyclooctyl.

Examples of the cyclic non-conjugated diene monomer of the formula (II-1) include but are not limited to

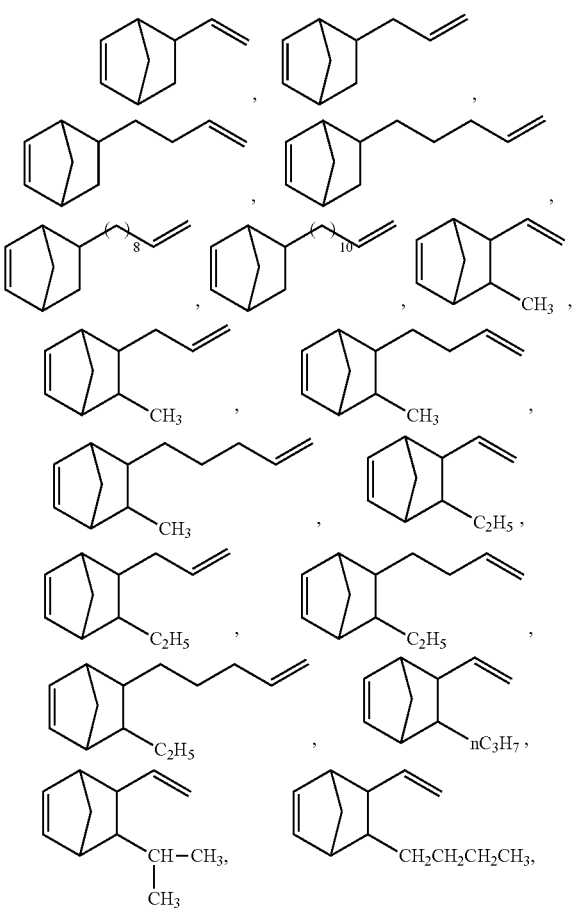

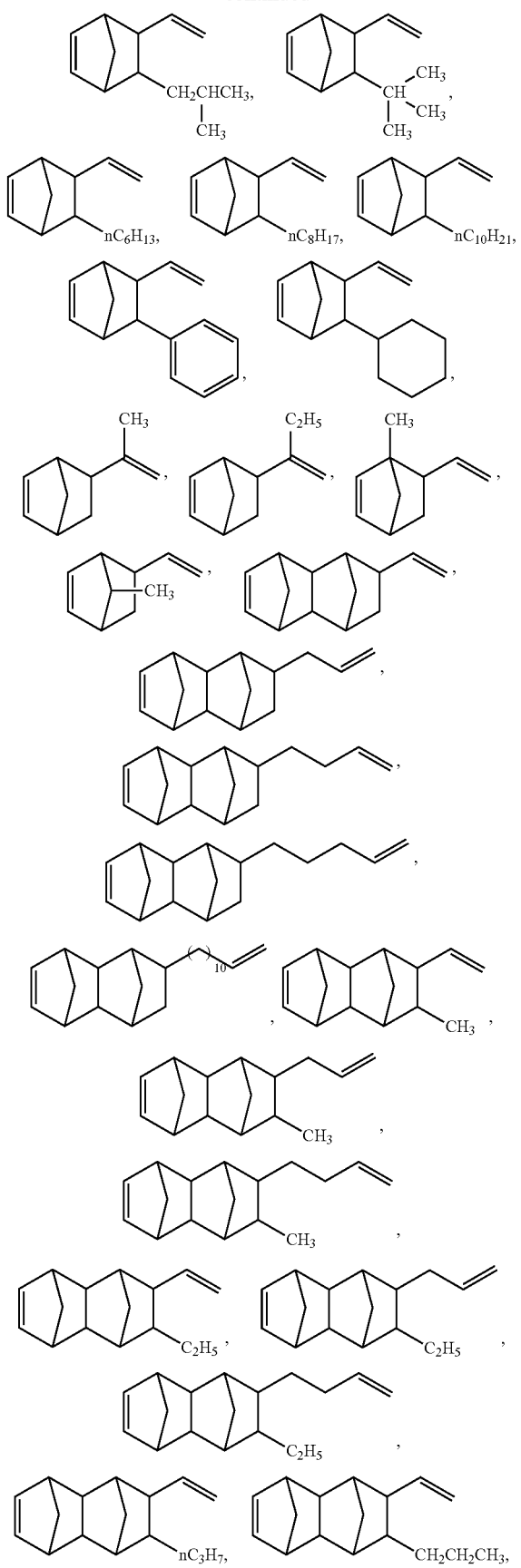

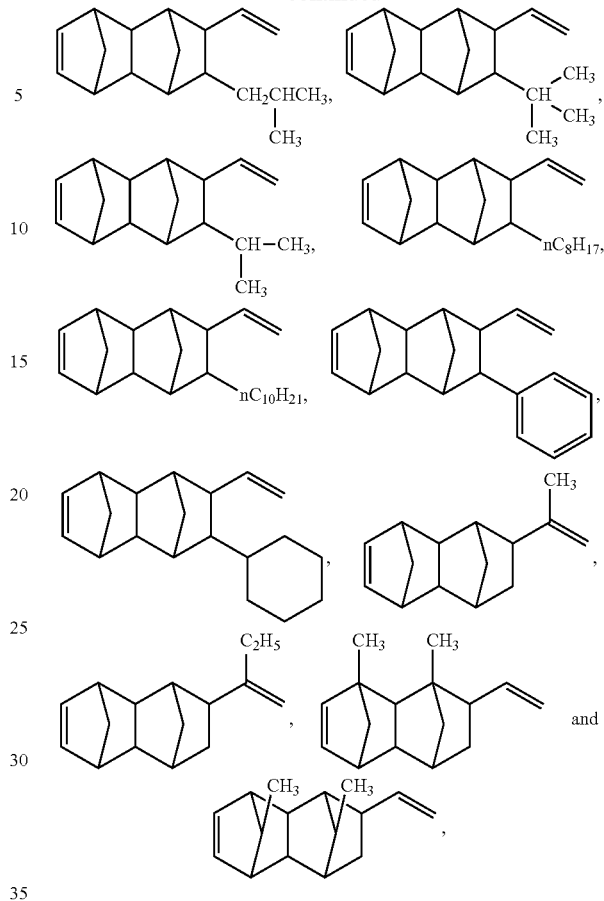

and each of the monomers can be used either alone or in any combination. In the appended Examples, the repeating unit (B-2) of formula (II) is formed by an addition copolymerization of 5-vinyl-2-norbornene

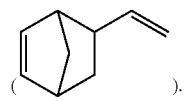

The repeating unit (B-3) of formula (III) is formed by an addition copolymerization of one or more cyclic olefin monomers of the following formula (III-1).

formula (III-1)

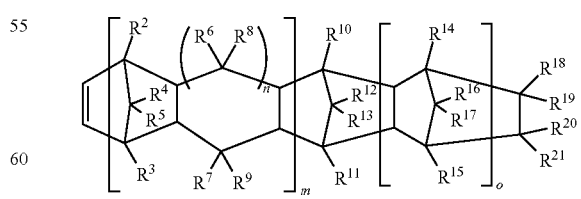

In formula (III-1), $R^2$ to $R^{19}$ are as defined above, the definition of $R^{20}$ and $R^{21}$ are identical to the definition of $R^2$ to $R^{19}$, wherein $R^{18}$ to $R^{21}$ may bind to each other to form a monocyclic ring or polycyclic ring; m and n are independently 0 or 1; o is 0 or a positive integer, preferably an integer from 0 to 50, and more preferably an integer from 0 to 20.

Examples of the cyclic olefin monomer of formula (III-1) include but are not limited to bicyclo[2.2.1]-2-heptene (norbornene,

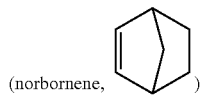
(norbornene, )

and tetracyclo[4.4.0.1$^{2,5}$. 1$^{7,10}$]-3-dodecene (tetracyclododecene

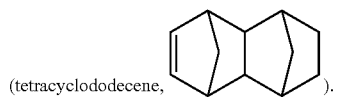
(tetracyclododecene, ).

In the appended Examples, the repeating unit (B-3) of formula (III) is formed by an addition copolymerization of tetracyclo[4.4.0.1$^{2,5}$.1$^{7,10}$]-3-dodecene.

In the cyclic olefin copolymer (B), based on the total moles of the repeating units (B-1), (B-2) and (B-3), the content of the repeating unit (B-2) ranges from 19 mol % to 36 mol %, preferably from 20 mol % to 33 mol %, and more preferably from 25 mol % to 30 mol %, such as 26 mol %, 27 mol %, 28 mol %, or 29 mol %. When the content of the repeating unit (B-2) is within the above designated ranges, the thermal-curable resin composition can provide long-term stable dielectric properties and excellent heat resistance, and provide an excellent balance between mechanical properties and dielectric properties.

Furthermore, in the cyclic olefin copolymer (B), based on the total moles of the repeating units (B-1) and (B-2), the content of the repeating unit (B-3) can range from 0.1 mol % to 100 mol %, preferably from 0.1 mol % to 50 mol %, and more preferably from 1 mol % to 20 mol %, such as 2 mol %, 3 mol %, 5 mol %, 7 mol %, 9 mol %, 10 mol %, 12 mol %, 13 mol %, 15 mol %, 17 mol %, or 19 mol %. When the content of the repeating unit (B-3) is within the above designated ranges, the cyclic olefin copolymer (B) can maintain a proper elastic modulus and the cross-linking reaction thereof is easy to control.

In addition to the aforementioned repeating units (B-1), (B-2) and (B-3), the cyclic olefin copolymer (B) may further comprise one or more repeating units formed by an addition copolymerization of other cyclic olefin monomers and/or linear polyene monomers. Said other cyclic olefin monomers exclude the cyclic non-conjugated diene monomers of formula (II-1) and the cyclic olefin monomers of formula (III-1).

The detailed description for the preparation of the cyclic olefin copolymer (B) can be found in, for example, U.S. Pat. No. 9,206,278 B2, the subject matters of which are incorporated herein in their entirety by reference.

In the prepreg of the present invention, based on the total weight of the thermal-curable resin composition, the amount of the cyclic olefin copolymer (B) may range from 30 wt % to 88 wt %, preferably from 40 wt % to 85 wt %, and more preferably from 50 wt % to 82 wt %, such as 51 wt %, 53 wt %, 55 wt %, 57 wt %, 60 wt %, 63 wt %, 65 wt %, 67 wt %, 70 wt %, 73 wt %, 75 wt %, 77 wt %, or 80 wt %.

Furthermore, in the prepreg of the present invention, the weight ratio of the cyclic olefin copolymer (B) to the unsaturated monomer (A) is within a specific range, such that the prepared metal-clad laminate is provided with an excellent peeling strength at room temperature and heat resistance. Specifically, the weight ratio of the cyclic olefin copolymer (B) to the unsaturated monomer (A) is 0.5 to 7, and preferably 0.6 to 2.4, such as 0.7, 0.8, 0.9, 1, 1.2, 1.3, 1.5, 1.7, 1.8, 2.0, 2.1, 2.2, or 2.3.

1.3. Optional Components

The thermal-curable resin composition for preparing the prepreg of the present invention may optionally comprise other components, such as additives well-known to persons having ordinary skill in the art, to improve the physico-chemical properties of the laminate prepared from the thermal-curable resin composition or the workability of the thermal-curable resin composition during manufacturing. Examples of the additives well-known to persons having ordinary skill in the art include but are not limited to a flame retardant, a catalyst, a filler, a curing accelerator, a dispersing agent, a toughener, a viscosity modifier, a thixotropic agent, a defoamer, a leveling agent, a surface treatment agent, a stabilizing agent, an antioxidant, etc. The above-mentioned additives can be used either alone or in any combination. After viewing the specification, persons having ordinary skill in the art can adjust the amount of each additive depending on the need in accordance with the ordinary skill, and the amount is not limited. Examples are illustrated as follows.

1.3.1. Flame Retardant

The thermal-curable resin composition of the present invention may optionally comprise a flame retardant to improve the flame retardance of the prepared electronic material. Examples of the flame retardant include but are not limited to a phosphorus-containing flame retardant and a bromine-containing flame retardant. Examples of the phosphorus-containing flame retardant include but are not limited to a phosphate ester, a phosphazene, a polyphosphate ammonium, a melamine phosphate, a melamine cyanurate, a metal phosphinate, and combinations thereof. Examples of the phosphazene include but are not limited to a cyclic phosphazene compound and a linear phosphazene compound. Examples of the cyclic phosphazene compound include but are not limited to hexaphenoxycyclotriphosphazene. Examples of the metal phosphinate include but are not limited to a metal salt compound with the following structure:

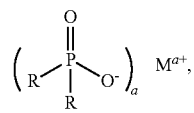

wherein, each R is independently a $C_1$ to $C_5$ alkyl; $M^{a+}$ is a metal ion selected from the group consisting of $Al^{3+}$, $Zn^{2+}$, $Ca^{2+}$, $Ti^{4+}$, $Mg^{2+}$, $Sr^{2+}$, $Ba^{2+}$, $K^+$, and $Cu^{2+}$; and a is an integer from 1 to 4.

Examples of the bromine-containing flame retardant include but are not limited to tetrabromobisphenol A, decabromodiphenyloxide, decabrominated diphenyl ethane, 1,2-bis(tribromophenyl) ethane, brominated epoxy oligomer, octabromotrimethylphenyl indane, bis(2,3-dibromopropyl ether), tris(tribromophenyl) triazine, brominated aliphatic hydrocarbon, and brominated aromatic hydrocarbon. The abovementioned flame retardants can be used either alone or in any combination.

1.3.2. Catalyst

The catalyst refers to a component that can promote a crosslinking reaction. The ordinary catalysts include but are not limited to an organic peroxide. Examples of the organic peroxide include but are not limited to dicumyl peroxide (DCP), α,α'-bis(t-butylperoxy)diisopropyl benzene (PER-BUTYL P), and benzoyl peroxide (BPO). The abovementioned catalysts can be used either alone or in any combination. In the appended Examples, α,α'-bis(t-butylperoxy) diisopropyl benzene is used as a catalyst.

1.3.3. Filler

Examples of the filler include but are not limited to silicon dioxide (e.g., hollow silicon dioxide), aluminum oxide, magnesium oxide, magnesium hydroxide, calcium carbonate, talc, clay, aluminum nitride, boron nitride, aluminum hydroxide, silicon aluminum carbide, silicon carbide, sodium carbonate, titanium dioxide, zinc oxide, zirconium oxide, quartz, diamond, diamond-like, graphite, calcined kaolin, pryan, mica, hydrotalcite, polytetrafluoroethylene (PTFE) powder, glass bead, ceramic whisker, carbon nanotube, nanosized inorganic powder, and combinations thereof.

1.3.4. Curing Accelerator

The curing accelerator refers to a component that can promote the curing reaction and lower the temperature of the curing reaction of the resin. The suitable curing accelerators include but are not limited to tertiary amines, quaternary ammonium salts, imidazoles, and pyridines. Examples of the imidazoles include but are not limited to 2-methylimidazole, 2-ethyl-4-methyl imidazole (2E4MZ), and 2-phenylimidazole. Examples of the pyridines include but are not limited to 2,3-diaminopyridine, 2,5-diaminopyridine, 2,6-diaminopyridine, 4-dimethylaminopyridine, 2-amino-3-methylpyridine, 2-amino-4-methylpyridine, and 2-amino-3-nitropyridine. The abovementioned curing accelerators can be used either alone or in any combination.

2. Preparation of Thermal-Curable Resin Composition

The thermal-curable resin composition of the present invention may be prepared into a varnish for subsequent applications by evenly mixing the unsaturated monomer (A), the cyclic olefin copolymer (B), and other optional components through a stirrer, and dissolving or dispersing the obtained mixture into a solvent. The solvent here can be any inert solvent that can dissolve or disperse the components of the thermal-curable resin composition but does not react with the components of the thermal-curable resin composition. Examples of the solvent that can dissolve or disperse the components of the thermal-curable resin composition include but are not limited to toluene, γ-butyrolactone, methyl ethyl ketone, cyclohexanone, butanone, acetone, xylene, methyl isobutyl ketone, N,N-dimethylformamide (DMF), N,N-dimethylacetamide (DMAc), N-methylpyrolidone (NMP), and combinations thereof. The amount of the solvent is not particularly limited as long as the components of the thermal-curable resin composition can be evenly dissolved or dispersed therein. In some embodiments of the present invention, toluene is used as the solvent.

3. Liquid Crystal Polymer Non-Woven Fabric

In the prepreg of the present invention, the liquid crystal polymer non-woven fabric comprises a liquid crystal polyester fiber. The liquid crystal polyester fiber is a polymer fiber obtained by polymerizing an aromatic diol, an aromatic dicarboxylic acid, an aromatic hydroxycarboxylic acid and so on. The liquid crystal polyester fiber has an optical anisotropy (liquid crystallinity) in a molten phase, which can be easily identified by raising the temperature of the sample on the heating stage in a nitrogen atmosphere and observing the transmitted light. In some embodiments of the present invention, the liquid crystal polyester fiber has one or more of the following repeating units (1) to (11):

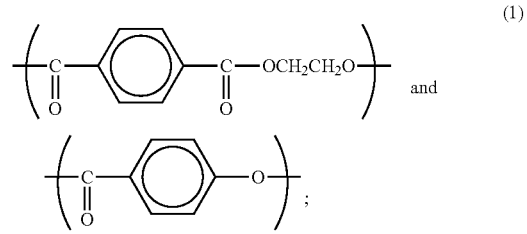

(1) and

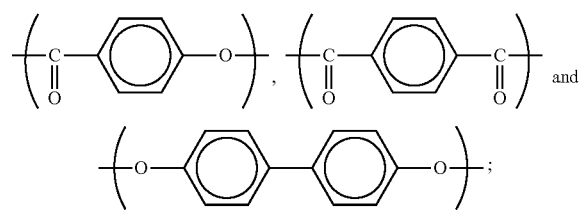

(2) and

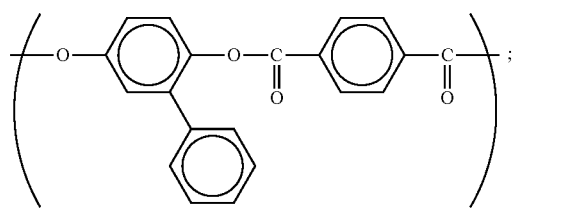

(3)

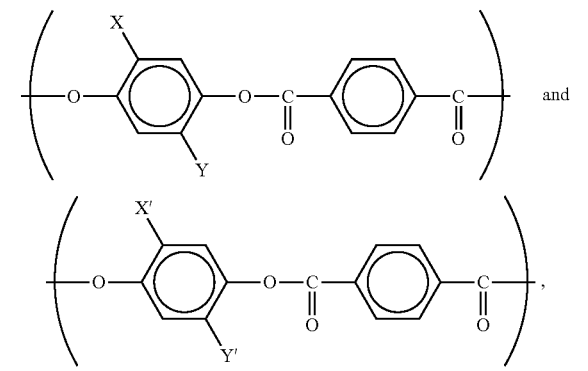

(4) and wherein X, X', Y and Y' are independently H, Cl, Br or methyl, and Z is
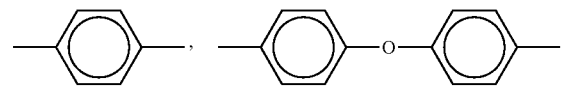
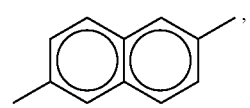
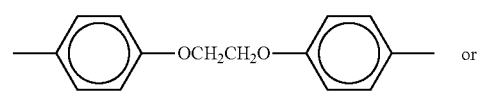
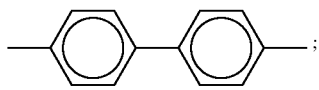
(5)
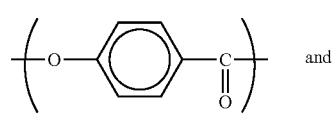
(6)
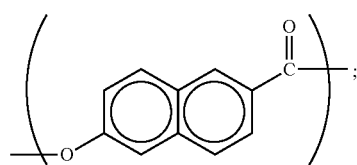
(7)
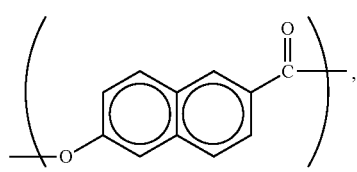
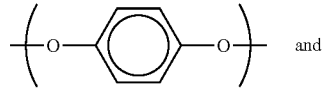
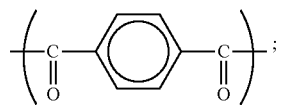
(8)
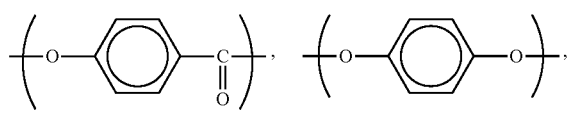
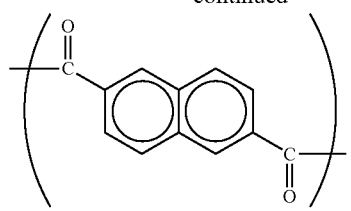
and
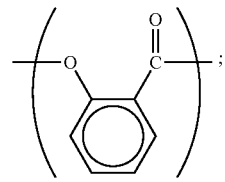
;
(9)
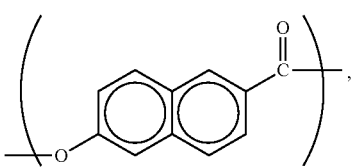
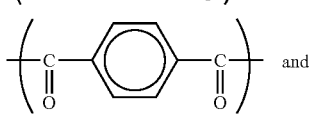
and
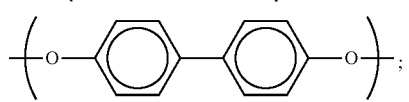
;
(10)
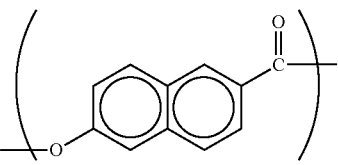
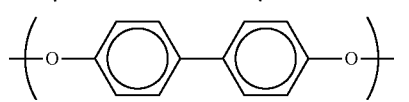
and
,
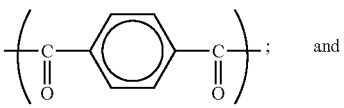
;   and
(11)
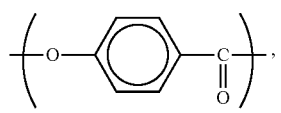
,
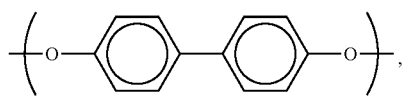
,

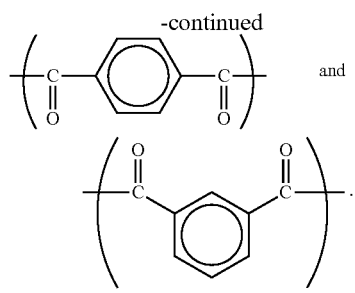

Based on 100 mol % of the total amount of repeating units in the liquid crystal polyester, the liquid crystal polyester fiber preferably has at least 65 mol % of repeating units of the following formulas (IV) and (V), and more preferably has 4 mol % to 45 mol % of repeating units of the formula (V).

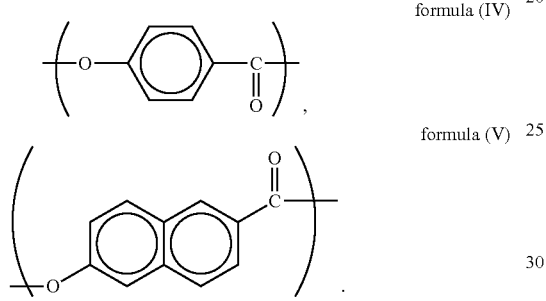

Furthermore, under the premise of substantially not reducing the strength, the liquid crystal polyester used in the present invention may further comprise other polymers or additives.

The liquid crystal polymer is a melt-blown nonwoven fabric, which is prepared by melt-extruding a liquid crystal polyester from die orifices, simultaneously blowing away the molten liquid crystal polyester in the form of fine filaments by using a high velocity hot gas, and then collecting on a suction collector surface (for example, a metallic wire web) to form a web. The web is subjected to calendering and heat treatment to obtain a non-woven fabric. The calendaring is carried out at a non-woven fabric surface temperature between 90° C. and the melting temperature of the molten liquid crystal polyester, under a linear pressure ranging from 50 kg/cm to 200 kg/cm.

The average diameter of the fibers collected on the suction collecor surface via the melt-blown method depends on the orifice diameter, the discharge amount, and the gas flow rate. The liquid crystal polyester fiber has an average diameter ranging from 0.6 μm to 20 μm and preferably 1 μm to 15 μm, and it is more preferable that the average diameter of 60% or more of the fiber ranges from 1 μm to 10 μm. The liquid crystal polyester fiber has elongations in the machine direction (MD) and the cross direction (CD) independently ranging from 1% to 8% and has strength, flexibility and gas permeability. The average diameter of fiber is an average value obtained by taking a magnifying picture of the non-woven fabric by a scanning electron microscope and measuring the diameter of any 100 fibers. The detailed description for the preparation of the liquid crystal polymer non-woven fabric can be found in, for example, JP 4429501, the subject matters of which are incorporated herein in their entirety by reference.

4. Preparation of Prepreg

The prepreg of the present invention is prepared by impregnating a liquid crystal polymer non-woven fabric with a thermal-curable resin composition or by coating a thermal-curable resin composition onto a liquid crystal polymer non-woven fabric and drying the impregnated or coated liquid crystal polymer non-woven fabric. The prepreg can also be prepared by first forming a film from a thermal-curable resin composition and then combining the film with a liquid crystal polymer non-woven fabric by a hot-pressing operation. In some embodiments of the present invention, the VECRUS liquid crystal polymer non-woven fabric available from Kuraray company is used as a reinforcing material, and a prepreg at a semi-cured stage is prepared by the following steps: impregnating the liquid crystal polymer non-woven fabric with a thermal-curable resin composition or by coating a thermal-curable resin composition onto the liquid crystal polymer non-woven fabric, followed by drying the impregnated or coated liquid crystal polymer non-woven fabric at 160° C. for 2 to 15 minutes (B-stage).

5. Metal-Clad Laminate and Printed Circuit Board

The present invention also provides a metal-clad laminate prepared from the abovementioned prepreg, which comprises a dielectric layer and a conductive layer, wherein the dielectric layer is formed by superimposing one or more layers of the abovementioned prepregs. The metal-clad laminate can be prepared by superimposing a metal foil (such as a copper foil) on at least one external surface of the dielectric layer composed of the superimposed prepregs to provide a superimposed object, and then performing a hot-pressing operation onto the superimposed object to obtain the metal-clad laminate.

Furthermore, the metal-clad laminate can form a printed circuit board by further patterning the conductive layer thereof. Examples of the ordinary method for patterning include but are not limited to etching.

6. Examples

6.1. Testing Methods

The present invention is further illustrated by the embodiments hereinafter, wherein the testing instruments and methods are as follows:

[Dielectric Constant (Dk) and Dissipation Factor (Df) Measurement]

The dielectric constant (Dk) and dissipation factor (Df) of the metal-clad laminate are measured according to IPC-TM-650 2.5.5.13 under an operating frequency of 10 GHz.

[Peeling Strength Test]

The peeling strength is used to show the bonding strength between the metal foil conductive layer and dielectric layer and is expressed as the force required to vertically peel copper foil with a width of ⅛ inch from the surface of the hot-pressed laminated prepreg. The unit of the peeling strength is pounds per inch (lbf/in).

[Flexibility Test]

The flexibility test is carried out by recording the number of MIT deflection according to the MIT method (JIS P8815). If the number of MIT deflection is greater than 100, it is recorded as "○"; if the number of MIT deflection is between 50 to 100, it is recorded as "Δ"; if the number of MIT deflection is less than 50, it is recorded as "x".

[Heat Resistance Test After Moisture Absorption]

The heat resistance test after moisture absorption is carried out according to JIS C5012 by evaluating the heat resistance of a metal-clad laminate subjected to a solder float at the specified conditions (60° C., relative humidity (RH) of 60%) after 120 hours. In detail, a metal-clad laminate is subjected to floating solder in a solder bath at 288° C. for 60 seconds, and then the metal-clad laminate after the floating solder is observed for whether there is any measling or blistering by using the eyes and optical microscopy (5× times or more). If no measling or blistering is observed, it is recorded as "○"; if these defects are observed, it is recorded as "x".

6.2. Raw Materials Used in Examples and Comparative Examples List

| Raw material | Description |
|---|---|
| Cyclic olefin copolymer | Available from Mitsui Chemicals Company |
| TAIC | Crosslinking agent, available from Evonik Company |
| DCP | Crosslinking agent, available from Nippon Steel & Sumikin Chemical Company |
| DVB | Crosslinking agent, available from Shin-Nakamura Chemicals Company |
| CTBN | Carboxyl-terminated polybutadiene-acrylonitrile, available from JSR Company |
| NC3000H | Resin, available from Nippon Kayaku Company |
| OP-935 | Flame retardant, available from Clariant Company |
| PERBUTYL P | Catalyst, available from NOF Company |
| 2E4MZ | Curing accelerator, available from Shikoku Chemicals Company |
| Liquid crystal polymer non-woven fabric 1 (MBBK40F) | Available from Kuraray Company |
| Liquid crystal polymer non-woven fabric 2 (MBBK14F) | Available from Kuraray Company |
| Liquid crystal polymer film (CT-Z) | Available from Kuraray Company |
| NE-glass fiber fabric (106) | Available from Nitto Boseki Company |

6.3. Preparation of Metal-Clad Laminate

The thermal-curable resin compositions of Examples 1 to 9 and Comparative Examples 1 to 6 were prepared according to the relative amounts of the components shown in Tables 1 and 2. In detail, the components were mixed at room temperature with a stirrer for 60 minutes, and thereafter, toluene (Examples 1 to 9 and Comparative Examples 1 to 3 and 5 and 6) or MEK (Comparative Example 4) was added thereinto. After stirring the resultant mixture at room temperature for 60 to 120 minutes, each of the thermal-curable resin compositions was obtained.

The prepregs of Examples 1 to 9 and Comparative Examples 1 to 6 were respectively prepared by using the prepared thermal-curable resin compositions (see Tables 1 and 2). In detail, liquid crystal polymer non-woven fabrics or glass fiber fabrics were respectively impregnated with the thermal-curable resin compositions of Examples 1 to 9 and Comparative Examples 2 to 6 by a roll coater; or the thermal-curable resin composition of Comparative Example 1 was coated onto both the upper and lower surfaces of the liquid crystal polymer film with a thickness of 13 μm by a coater. Then, the impregnated or coated liquid crystal polymer non-woven fabrics, glass fiber fabrics and liquid crystal polymer film were placed in an oven and dried at 160° C. for 3 minutes to produce prepregs.

The metal-clad laminates of Examples 1 to 9 and Comparative Examples 1 to 6 were respectively prepared by using the prepared prepregs. In detail, the copper foil and one of the prepared prepregs were superimposed, and then subjected to a hot-pressing operation to obtain metal-clad laminates of Examples 1 to 9 and Comparative Examples 1 to 6, respectively. The hot-pressing conditions were as follows: heating to 200° C. to 220° C. at a heating rate of 3.0° C./min, and hot-pressing for 180 minutes under a full pressure of 15 kg/cm² (initial pressure was 8 kg/cm²) at said temperature.

TABLE 1

Compositions of the prepregs of Examples

| | | | Examples | | | | | | | | |
|---|---|---|---|---|---|---|---|---|---|---|---|
| | | | 1 | 2 | 3 | 4 | 5 | 6 | 7 | 8 | 9 |
| Thermal-curable resin composition (Unit: Parts by weight) | Cyclic olefin copolymer | | 70 | 70 | 70 | 70 | 60 | 50 | 40 | 45 | 60 |
| | Crosslinking agent | TAIC | 30 | 30 | 0 | 0 | 40 | 50 | 60 | 0 | 40 |
| | | DCP | 0 | 0 | 30 | 0 | 0 | 0 | 0 | 55 | 0 |
| | | DVB | 0 | 0 | 0 | 30 | 0 | 0 | 0 | 0 | 0 |
| | Carboxyl-terminated polybutadiene-acrylonitrile (CTBN) | | 0 | 0 | 0 | 0 | 0 | 0 | 0 | 0 | 0 |
| | NC3000H | | 0 | 0 | 0 | 0 | 0 | 0 | 0 | 0 | 0 |
| | Flame retardant (OP-935) | | 0 | 0 | 0 | 0 | 0 | 0 | 0 | 0 | 35 |
| | Catalyst (PERBUTYL P) | | 0.5 | 0.5 | 0.5 | 0.5 | 0.5 | 0.5 | 0.5 | 0.5 | 0.5 |
| | Curing accelerator (2E4MZ) | | 0 | 0 | 0 | 0 | 0 | 0 | 0 | 0 | 0 |

TABLE 1-continued

Compositions of the prepregs of Examples

| | | Examples | | | | | | | | |
|---|---|---|---|---|---|---|---|---|---|---|
| | | 1 | 2 | 3 | 4 | 5 | 6 | 7 | 8 | 9 |
| Reinforcing material (Unit: Numbers) | Liquid crystal polymer non-woven fabric 1 | 1 | 0 | 0 | 0 | 0 | 0 | 0 | 0 | 0 |
| | Liquid crystal polymer non-woven fabric 2 | 0 | 1 | 1 | 1 | 1 | 1 | 1 | 1 | 1 |
| | Liquid crystal polymer film | 0 | 0 | 0 | 0 | 0 | 0 | 0 | 0 | 0 |
| | NE-glass fiber fabric | 0 | 0 | 0 | 0 | 0 | 0 | 0 | 0 | 0 |

TABLE 2

Compositions of the prepregs of Comparative Examples

| | | | Comparative Examples | | | | | |
|---|---|---|---|---|---|---|---|---|
| | | | 1 | 2 | 3 | 4 | 5 | 6 |
| Thermal-curable resin composition (Unit: Parts by weight) | Cyclic olefin copolymer | | 70 | 70 | 100 | 0 | 88 | 30 |
| | Crosslinking agent | TAIC | 30 | 30 | 0 | 0 | 12 | 70 |
| | | DCP | 0 | 0 | 0 | 0 | 0 | 0 |
| | | DVB | 0 | 0 | 0 | 0 | 0 | 0 |
| | Carboxyl-terminated polybutadiene-acrylonitrile (CTBN) | | 0 | 0 | 0 | 70 | 0 | 0 |
| | NC3000H | | 0 | 0 | 0 | 30 | 0 | 0 |
| | Flame retardant (OP-935) | | 0 | 0 | 0 | 0 | 0 | 0 |
| | Catalyst (PERBUTYL P) | | 0.5 | 0.5 | 0.5 | 0 | 0.5 | 0.5 |
| | Curing accelerator (2E4MZ) | | 0 | 0 | 0 | 0.1 | 0 | 0 |
| Reinforcing material (Unit: Numbers) | Liquid crystal polymer non-woven fabric 1 | | 0 | 0 | 1 | 1 | 1 | 1 |
| | Liquid crystal polymer non-woven fabric 2 | | 0 | 0 | 0 | 0 | 0 | 0 |
| | Liquid crystal polymer film | | 1 | 0 | 0 | 0 | 0 | 0 |
| | NE-glass fiber fabric | | 0 | 1 | 0 | 0 | 0 | 0 |

6.4. Properties of Metal-Clad Laminate

The properties of the metal-clad laminates of Examples 1 to 9 and Comparative Examples 1 to 6, including dielectric constant (Dk), dissipation factor (Df), flexibility, heat resistance after moisture absorption and peeling strength, were measured according to the aforementioned testing methods, and the results are tabulated in Tables 3 and 4.

TABLE 3

Properties of the metal-clad laminates of Examples

| | Examples | | | | | | | | |
|---|---|---|---|---|---|---|---|---|---|
| | 1 | 2 | 3 | 4 | 5 | 6 | 7 | 8 | 9 |
| Thickness (μm) | 75 | 40 | 41 | 42 | 42 | 42 | 41 | 41 | 45 |
| Dk (10 GHz) | 2.7 | 2.7 | 2.7 | 2.7 | 2.8 | 2.8 | 2.8 | 2.8 | 2.8 |
| Df, ×10$^{-3}$ (10 GHz) | 1.7 | 1.6 | 1.5 | 1.5 | 1.8 | 1.9 | 2.0 | 1.8 | 2.1 |
| Peeling strength (lbf/in) | 5.1 | 5.0 | 5.0 | 5.0 | 4.6 | 4.2 | 4.0 | 4.3 | 4.0 |
| Flexibility (MIT) | ○ | ○ | ○ | ○ | ○ | ○ | ○ | ○ | Δ |
| Heat resistance | ○ | ○ | ○ | ○ | ○ | ○ | ○ | ○ | ○ |

TABLE 4

Properties of the metal-clad laminates of Comparative Examples

| | Comparative Examples | | | | | |
|---|---|---|---|---|---|---|
| | 1 | 2 | 3 | 4 | 5 | 6 |
| Thickness (μm) | 76 | 50 | 75 | 73 | 74 | 74 |
| Dk (10 GHz) | 2.9 | 3.1 | 2.5 | 3.4 | 2.6 | 2.8 |
| Df, ×10$^{-3}$ (10 GHz) | 2.0 | 1.9 | 1.4 | 8.6 | 1.5 | 2.1 |
| Peeling strength (lbf/in) | 2.5 | 4.6 | 5.2 | 4.5 | 5.0 | 3.4 |
| Flexibility (MIT) | Δ | x | ○ | ○ | ○ | Δ |
| Heat resistance | x | ○ | x | ○ | x | ○ |

As shown in Table 3, in addition to having a good flexibility, a low dielectric constant (Dk), a low dissipation factor (Df) and a high heat resistance, each of the metal-clad laminates prepared from the prepregs of the present invention further has a high peeling strength between the prepregs and the copper foils.

In contrast, as shown in Table 4, metal-clad laminates prepared by using prepregs other than that of the present invention cannot achieve a satisfactory level in all physicochemical properties and dielectric properties, and do not have a good peeling strength between the prepregs and the copper foils. Specifically, as shown in Comparative Example 1, when the metal-clad laminate uses a liquid crystal polymer film, the flexibility, peeling strength and heat resistance thereof are poor. As shown in Comparative Example 2, when the metal-clad laminate uses a NE-glass fiber fabric, the flexibility and dielectric constant thereof are poor. As shown in Comparative Example 3, when the thermal-curable resin composition only contains the cyclic olefin copolymer, the heat resistance thereof is insufficient. As shown in Comparative Example 4, compared with the thermal-curable resin composition of the present invention, when using other thermal-curable resin compositions, the metal-clad laminate cannot achieve a satisfactory level in electric properties. As shown in Comparative Example 5, when the weight ratio of the cyclic olefin copolymer (B) to the unsaturated monomer (A) is greater than 7, the heat resistance of the metal-clad laminate is insufficient. As shown in Comparative Example 6, when the weight ratio of the cyclic olefin copolymer (B) to the unsaturated monomer (A) is less than 0.5, the flexibility and peeling strength of the metal-clad laminate are poor.

The above examples are used to illustrate the principle and efficacy of the present invention and show the inventive features thereof. People skilled in this field may proceed with a variety of modifications and replacements based on the disclosures and suggestions of the invention as described without departing from the principle and spirit thereof. Therefore, the scope of protection of the present invention is that as defined in the claims as appended.

What is claimed is:

1. A prepreg, which is prepared by impregnating a liquid crystal polymer non-woven fabric with a thermal-curable resin composition or by coating a thermal-curable resin composition onto a liquid crystal polymer non-woven fabric and drying the impregnated or coated liquid crystal polymer non-woven fabric, wherein the thermal-curable resin composition comprises:
   (A) an unsaturated monomer; and
   (B) a cyclic olefin copolymer comprising the following repeating units:

(B-1) a repeating unit of formula (I),

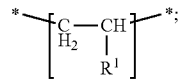

formula (I);

(B-2) a repeating unit of formula (II),

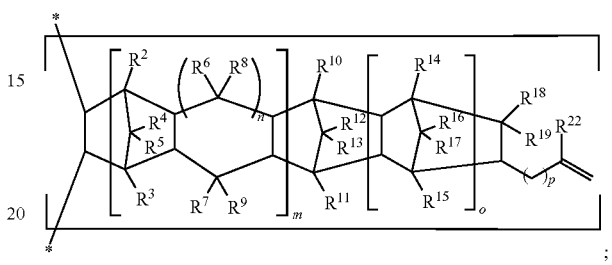

formula (II);

and
(B-3) a repeating unit of formula (III),

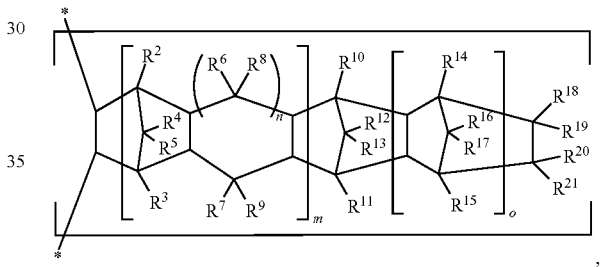

formula (III), wherein, in formulas (I) to (III),
$R^1$ is H or a $C_1$ to $C_{29}$ linear or branched hydrocarbon group;
$R^2$ to $R^{21}$ are independently H, a halogen, a $C_1$ to $C_{20}$ alkyl, a $C_1$ to $C_{20}$ halogenated alkyl, a $C_3$ to $C_{15}$ cycloalkyl, or a $C_6$ to $C_{20}$ aromatic hydrocarbyl;
$R^{18}$ to $R^{21}$ may bind to each other to form a monocyclic ring or polycyclic ring;
$R^{22}$ is H or a $C_1$ to $C_{10}$ alkyl;
m and n are independently 0 or 1;
o is 0 or a positive integer;
p is an integer from 0 to 10; and
in formula (III), when both m and n are 0, at least one of $R^{10}$ to $R^{13}$ and $R^{18}$ to $R^{21}$ is not H,
wherein, based on the total moles of the repeating units (B-1), (B-2) and (B-3), the content of the repeating unit (B-2) is 19 mol % to 36 mol %;
wherein the weight ratio of the cyclic olefin copolymer (B) to the unsaturated monomer (A) is 0.6 to 2.4; and
wherein the unsaturated monomer (A) is selected from the group consisting of an alkenyl-containing aromatic monomer, an allyl-containing monomer, an acryoyl-containing monomer, a vinyl ether, a maleimide, and combinations thereof.

2. The prepreg of claim 1, wherein the allyl-containing monomer is an organic compound comprising at least one allyl.

3. The prepreg of claim 2, wherein the allyl-containing monomer is selected from the group consisting of diallyl phthalate, diallyl isophthalate, triallyl mellitate, triallyl mesate, triallyl benzene, triallyl cyanurate, triallyl isocyanurate, triallyl amine, and combinations thereof.

4. The prepreg of claim 1, wherein IV is $H^1$ or a C1 to C6 alkyl.

5. The prepreg of claim 1, wherein the repeating unit (B-2) is formed by the addition copolymerization of cyclic non-conjugated diene monomers, wherein the cyclic non-conjugated diene monomer is selected from the group consisting of

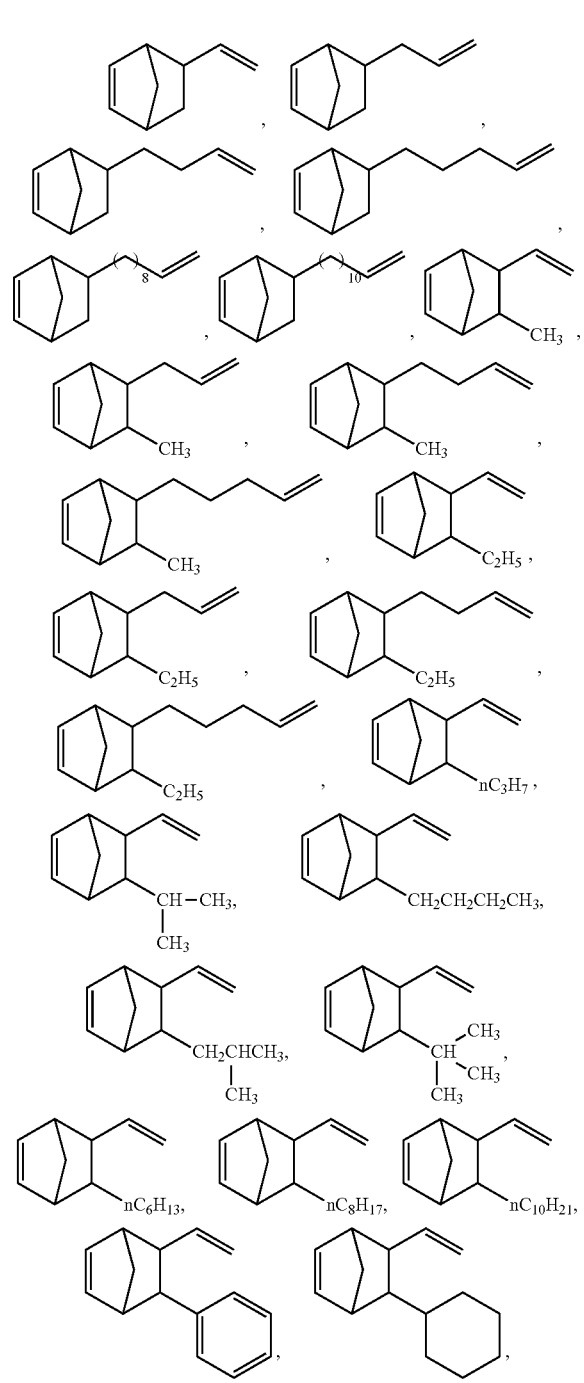

-continued

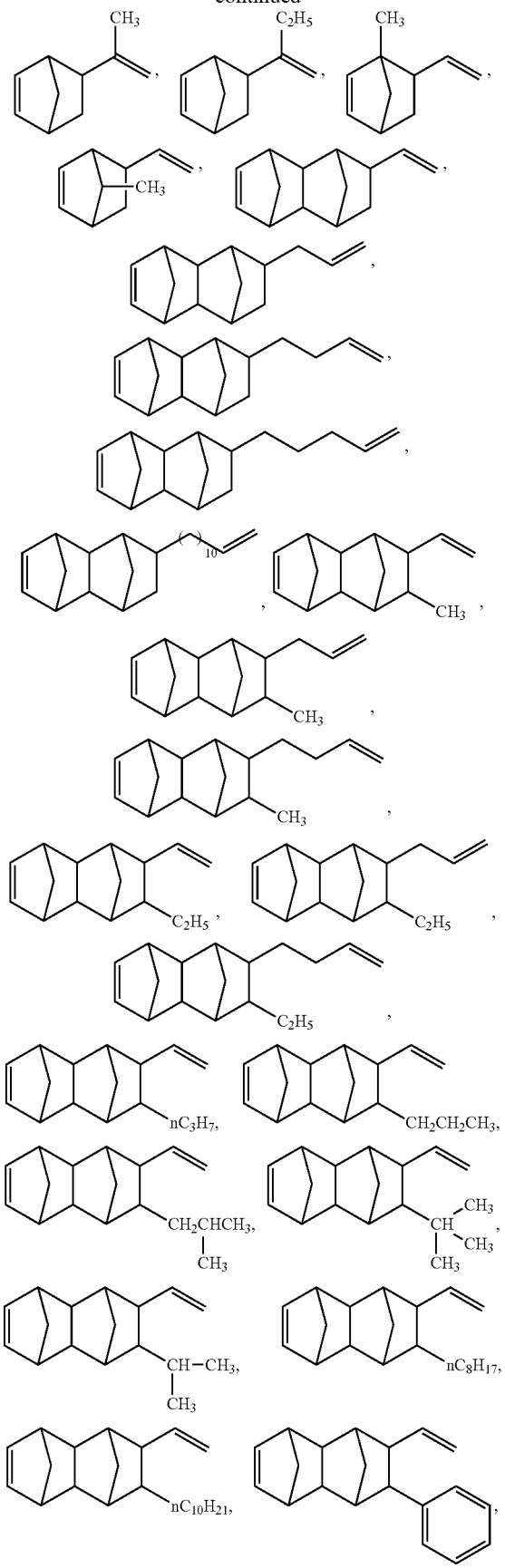

-continued

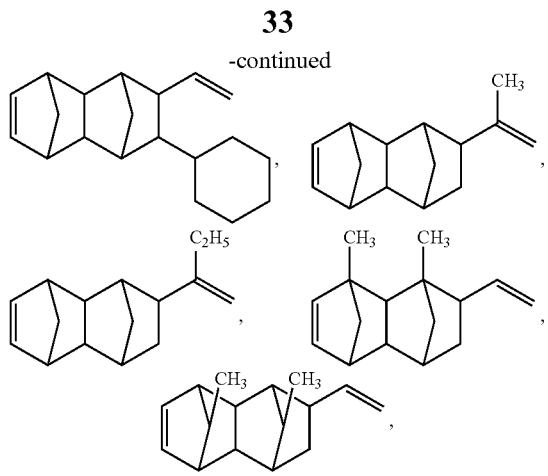

and combinations thereof.

6. The prepreg of claim 1, wherein, based on the total moles of the repeating units (B-1), (B-2) and (B-3), the content of the repeating unit (B-2) is 20 mol % to 33 mol %.

7. The prepreg of claim 1, wherein the thermal-curable resin composition further comprises a flame retardant, a catalyst, a filler, a curing accelerator, a dispersing agent, a toughener, a viscosity modifier, a thixotropic agent, a defoamer, a leveling agent, a surface treatment agent, a stabilizing agent, an antioxidant, or combinations thereof.

8. The prepreg of claim 7, wherein the flame retardant is selected from the group consisting of a phosphorus-containing flame retardant, a bromine-containing flame retardant, and combinations thereof.

9. The prepreg of claim 7, wherein the catalyst is selected from the group consisting of dicumyl peroxide, α,α'-bis(t-butylperoxy)diisopropyl benzene, benzoyl peroxide, and combinations thereof.

10. The prepreg of claim 1, wherein the liquid crystal polymer non-woven fabric comprises a liquid crystal polyester fiber having an average diameter ranging from 0.6 μm to 20 μm and elongations in the machine direction (MD) and the cross direction (CD) independently ranging from 1% to 8%.

11. The prepreg of claim 10, wherein the liquid crystal polyester fiber has one or more of the following repeating units (1) to (11):

(1)

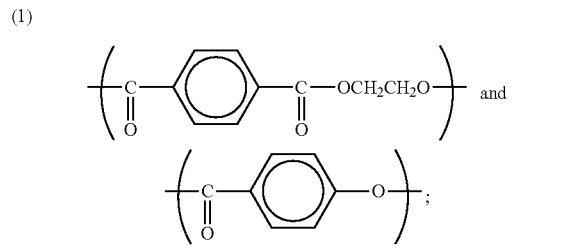

(2)

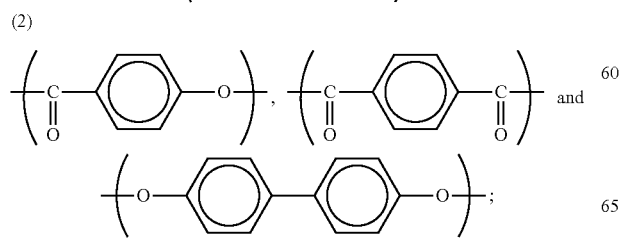

(3)

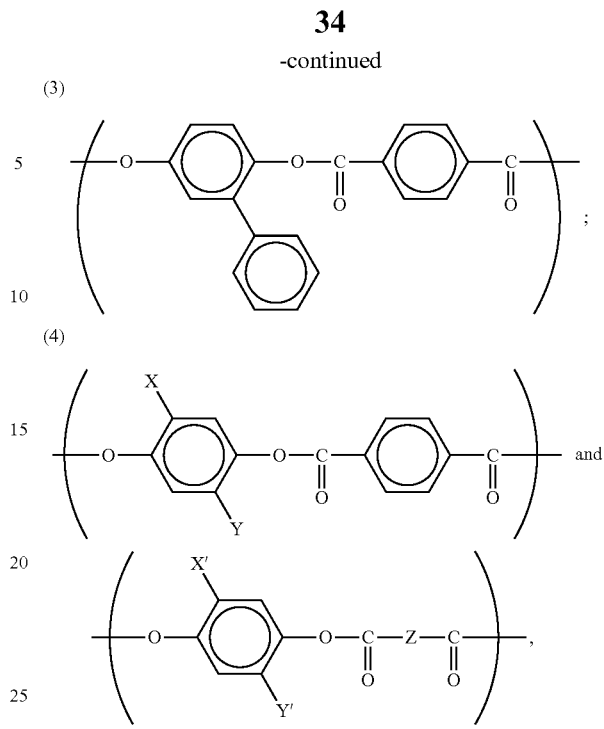

(4)

wherein X, X', Y and Y' are independently H, Cl, Br or methyl, and Z is

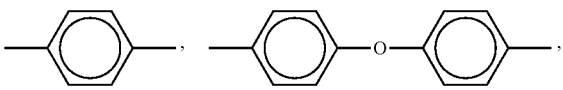
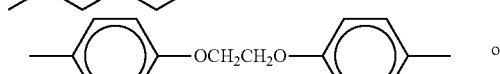
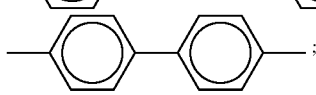
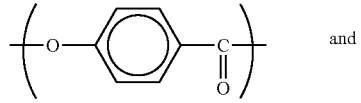

(5)

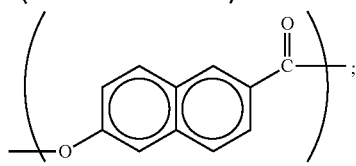

(6)

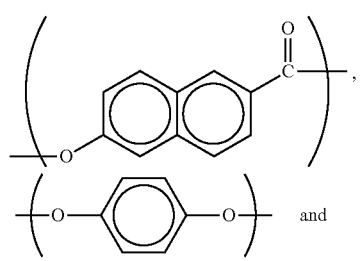

-continued

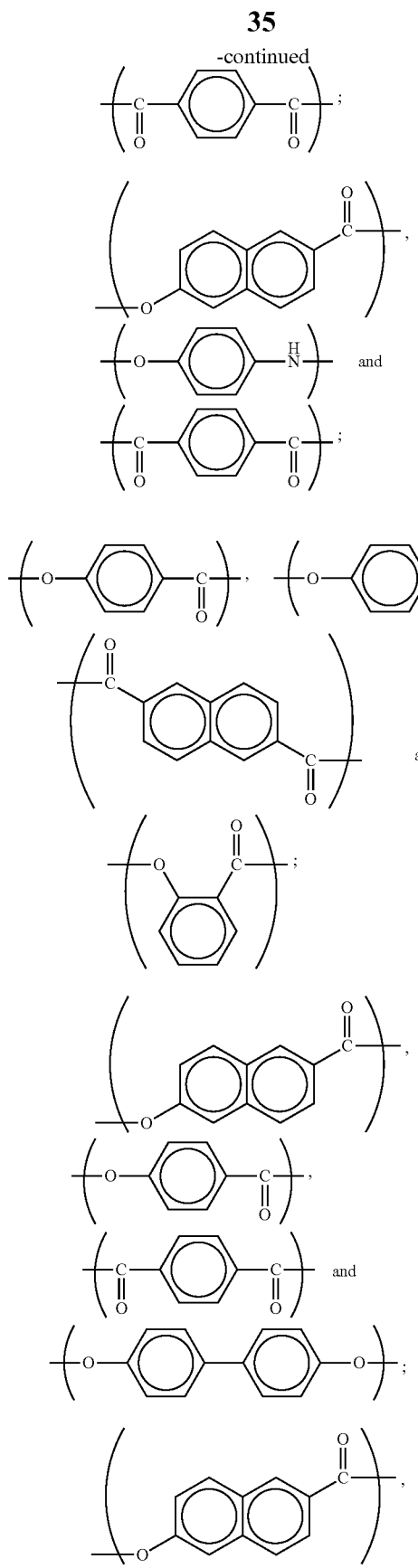

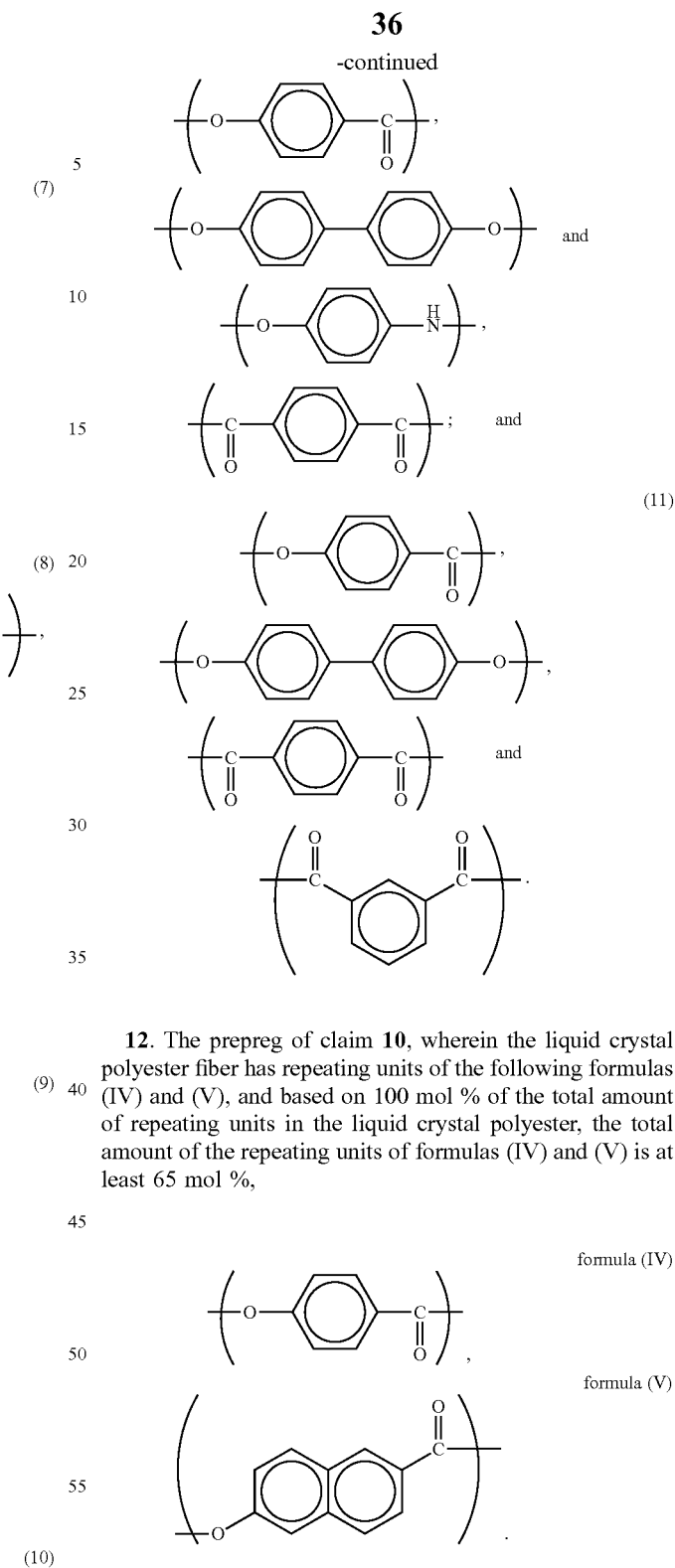

12. The prepreg of claim 10, wherein the liquid crystal polyester fiber has repeating units of the following formulas (IV) and (V), and based on 100 mol % of the total amount of repeating units in the liquid crystal polyester, the total amount of the repeating units of formulas (IV) and (V) is at least 65 mol %, 13. A metal-clad laminate, which is prepared by laminating the prepreg of claim 1 and a metal foil.

14. A printed circuit board, which is prepared from the metal-clad laminate of claim 13.

* * * * *